US006541374B1

(12) United States Patent
de Felipe et al.

(10) Patent No.: US 6,541,374 B1
(45) Date of Patent: Apr. 1, 2003

(54) METHOD OF DEPOSITING A DIFFUSION BARRIER FOR COPPER INTERCONNECTION APPLICATIONS

(75) Inventors: Tarek Suwwan de Felipe, Mountain View, CA (US); Michal Danek, Cupertino, CA (US); Erich Klawuhn, San Jose, CA (US); Ronald A. Powell, San Carlos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/965,471

(22) Filed: Sep. 26, 2001

Related U.S. Application Data
(60) Provisional application No. 60/256,772, filed on Dec. 18, 2000.

(51) Int. Cl.[7] .......................................... H01L 21/4763
(52) U.S. Cl. ..................... 438/648; 438/653; 438/656; 438/687
(58) Field of Search ................... 438/653, 658, 438/648, 683, 656, 687

(56) References Cited

U.S. PATENT DOCUMENTS 5,139,825 A    8/1992   Gordon et al.
6,271,591 B1 * 8/2001   Dubin et al. ................ 257/751

* cited by examiner

Primary Examiner—Jey Tsai
(74) Attorney, Agent, or Firm—Beyer Weaver & Thomas, LLP

(57) ABSTRACT

The present invention pertains to methods for forming diffusion barrier layers in the context of integrated circuit fabrication. Methods of the invention allow selective deposition of a metal-nitride barrier layer material on a partially fabricated integrated circuit having exposed conductor and dielectric regions and conversion of the metal-nitride barrier material into an effective diffusion barrier layer having low via resistance. In a preferred method using TiN, differential morphology in a single barrier layer deposition is achieved by controlling CVD process conditions. It is believed that the absolute amount of TiN deposited on the conductor is not reduced, but the morphology of is changed so that there is little or no increase in the via resistance after barrier formation. The invention also pertains to novel integrated circuit structures resulting from application of the described methods.

20 Claims, 11 Drawing Sheets

METHOD OF DEPOSITING A DIFFUSION BARRIER FOR COPPER INTERCONNECTION APPLICATIONS

CROSS-REFERENCE TO RELATED APPLICATIONS

This application claims priority under 35 USC 119(e) from U.S. Provisional Patent Application No. 60/256,772 naming Danek et al. as inventors, titled "Method of Depositing a Diffusion Barrier for Copper Interconnection Applications," filed Dec. 18, 2000, which is incorporated herein by reference in its entirety for all purposes. This patent application is related to U.S. Patent applications Ser. No. 09/776,702, titled "Anti-Agglomeration of Copper in Integrated Circuit Metalization" filed by Rozbicki on Feb. 2, 2001, U.S. Patent application Ser. No. 09/862,539, titled "Improved Deposition of Conformal Copper Seed Layers by Control of Barrier Layer Morphology" filed by Suwwan de Felipe on May 21, 2001, and U.S. Patent application Ser. No. 09/754,432 "Method of Depositing Barrier-Seed Layer on Semiconductor Substrates" filed by Rozbicki et al. on the same date as this application. These patent applications, along with all other patent applications, patents, and publications mentioned herein are incorporated by reference in their entirety for all purposes.

FIELD OF THE INVENTION

The present invention pertains to methods for forming diffusion barrier layers in the context of integrated circuit fabrication. Methods of the invention allow selective deposition of a metal-nitride barrier layer material on a partially fabricated integrated circuit having exposed conductor and dielectric regions and conversion of the metal-nitride barrier material into an effective diffusion barrier layer having low via resistance. The invention also pertains to novel integrated circuit structures resulting from application of the described methods.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing. Damascene processing is often a preferred method because it requires fewer processing steps than other methods and offers a higher yield. It is also particularly well-suited to metals such as Cu that cannot readily be patterned by plasma etching.

Damascene processing is a method for forming metal lines on integrated circuits. It involves formation of inlaid metal lines in trenches and vias formed in a dielectric layer (inter-metal dielectric). Damascene processing is often a preferred method because it requires fewer processing steps than other methods and offers a higher yield. It is also particularly well-suited to metals such as Cu that cannot readily be patterned by plasma etching. In order to frame the context of this invention, a brief description of a copper dual Damascene process for forming a partially fabricated integrated circuit is described below.

Presented in FIGS. 1A–1G, is a cross sectional depiction of a dual Damascene fabrication process. Referring to FIG. 1A, an example of a typical substrate, 100, used for dual damascene fabrication is illustrated. Substrate 100 includes a pre-formed dielectric layer 103 (such as silicon dioxide or organic-containing low-k materials) with etched line paths (trenches and vias) in which; a diffusion barrier layer 105 has been deposited followed by inlaying with copper conductive routes 107. Because copper or other mobile conductive material provides the conductive paths of the semiconductor wafer, the underlying silicon devices must be protected from metal ions (e.g., copper) that might otherwise diffuse into the silicon. Suitable materials for diffusion barrier layer 105 include tantalum, tantalum nitride, tungsten, titanium, titanium tungsten, titanium nitride, and the like. In a typical process, barrier layer 105 is formed by a physical vapor deposition (PVD) process such as sputtering or a chemical vapor deposition (CVD) process. Typical metals for the conductive routes are aluminum and copper. More frequently, copper serves as the metal in damascene processes, as depicted in these figures. The resultant partially fabricated integrated circuit 100 is a representative substrate for subsequent Damascene processing, as depicted in FIGS. 1B–1G.

As depicted in FIG. 1B, a silicon nitride or silicon carbide diffusion barrier 109 is deposited to encapsulate conductive routes 107. Next, a first dielectric layer, 111, of a dual damascene dielectric structure is deposited on diffusion barrier 109. This is followed by deposition of an etch-stop layer 113 (typically composed of silicon nitride or silicon carbide) on the first dielectric layer 111.

The process follows, as depicted in FIG. 1C, where a second dielectric layer 115 of the dual damascene dielectric structure is deposited in a similar manner to the first dielectric layer 111, onto etch-stop layer 113. Deposition of an antireflective layer 117, typically a silicon oxynitride, follows.

The dual Damascene process continues, as depicted in FIGS. 1D–1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Next, as depicted in FIG. 1F, these newly formed vias and trenches are, as described above, coated with a conformal diffusion barrier 123. As mentioned above, barrier 123 comprises tantalum, titanium, or other materials that effectively block diffusion of copper atoms into the dielectric layers.

After diffusion barrier 123 is deposited, a seed layer of copper is applied (typically a PVD process) to enable subsequent electrofilling of the features with copper inlay. FIG. 1G shows the completed dual Damascene process, wherein copper conductive routes 125 are inlaid (seed layer not depicted) into the via and trench features over barrier layer 123.

Copper routes 125 and 107 are now in electrical contact and form conductive pathways, as they are separated by only by diffusion barrier 123 which is itself somewhat conductive. Although conformal barrier layers are sufficiently conductive for conventional circuitry, with the continuing need for faster (signal propagation speed) and more reliable microchip circuitry, the resistance of conformal barrier layers comprised of the materials mentioned above is problematic. To reduce resistance between the copper routes, a portion of the barrier layer may be etched away in order to expose the lower copper plug. In this way, the subsequent copper inlay can be deposited directly onto the lower copper plug. Conventional methods for etching away barrier layers only at the bottom of vias (for example, the region of barrier layer 123 contacting copper inlay 107 in FIG. 1F) are problematic in that their not selective enough. That is, conventional etch methods remove barrier material from undesired areas as well, such as the corners (edges) of the via, trench, and, field regions. This can destroy critical dimensions of the via and trench features (faceting of the corners) and unnecessarily exposes the dielectric to plasma.

In addition, conventional etching methods do not address unlanded contact regions. As illustrated in FIG. 1F, a portion of barrier layer 123 located at via bottom 127 does not fully contact copper inlay 107. In this case, a portion of the barrier rests on copper inlay 107 and a portion rests on dielectric 103. A conventional barrier layer etch, meant to expose copper inlay 107, would expose both copper inlay 107 and dielectric 103 in region 127. In that case, more process steps would be needed to repair or replace barrier layer on the newly-exposed region of dielectric 103, before any subsequent copper could be deposited thereon. Using conventional unselective "blanket" conformal deposition methods to reprotect the dielectric, one would create the same problem that existed before the etch, that is, higher resistance between copper routes due to the barrier layer itself.

What is therefore needed is a way to selectively form barrier layers on integrated circuit structures, such that barrier layer material deposited on exposed dielectric surfaces is conformal and continuous, while barrier material deposited on exposed conductor surfaces is discontinuous. In this way, the resistance between inlayed metal conductive routes is reduced.

SUMMARY OF THE INVENTION

The present invention provides methods for forming diffusion barrier layers in the context of integrated circuit fabrication. Methods of the invention feature selective deposition of a metal-nitride barrier layer material on a partially fabricated integrated circuit having exposed conductor and dielectric regions and conversion of the metal-nitride barrier material into a diffusion barrier layer having low resistance in the vias.

In a preferred embodiment of the invention, the selective deposition of the metal-nitride barrier material is achieved by controlling process conditions during chemical vapor deposition. This method allows one to take advantage of the differential material properties of conductor and dielectric. In a single deposition, barrier material is deposited on dielectric and conductor regions of a partially fabricated integrated circuit; the morphology of the deposited material is continuous on the dielectric regions and discontinuous on the conductor regions. The discontinuity of the barrier material on the conductor regions allows for lower electrical resistance between the conductor regions and subsequently applied conductive routes.

One aspect of the invention pertains to a method for forming a diffusion barrier layer on a partially fabricated integrated circuit, said circuit containing exposed regions of a dielectric and a conductor. The method comprises depositing a metal-nitride barrier material onto the partially fabricated integrated circuit such that the morphology of the metal-nitride barrier material on the dielectric is continuous and the morphology of the metal-nitride barrier material on the conductor is discontinuous; and converting at least part of the metal-nitride barrier material to a metal silicon nitride to form the diffusion barrier layer. The method is particularly useful in Damascene processing, especially when copper is the metal used for conductive routes.

In a preferred embodiment, TiN is the metal-nitride barrier material. Preferably it is deposited by exposing the partially fabricated integrated circuit to a gas-phase mixture of a tetrakis(dialkylamido) titanium compound and ammonia, while the partially fabricated integrated circuit is heated. A preferred compound for the method is tetrakis (diethylamido) titanium, or TDEAT. Generally, the partially fabricated integrated circuit (wafer) is heated to between about 100 and 400° C. and the gas-phase mixture is passed over the wafer at reduced pressure. The flow rates and ratios of the gases in the gas-phase mixture is dependent on the particular method used, as will be discussed in more detail in the detailed description below. The method is performed at pressures in the range of between about 10 and 400 torr, more preferably between about 50 and 70 torr.

Preferably the TiN barrier material deposited on the dielectric is between about 10 Å and 100 Å thick, even more preferably about 50 Å thick. It is most desirable that the TIN barrier material is deposited on the dielectric at a rate of between about 1 and 10 Å per second.

A preferred way of converting the selectively deposited TiN barrier material to titanium silicon nitride is by exposure of the deposited TiN barrier material to $SiH_4$. More specifically, performing an in-situ exposure of the deposited TiN barrier material to $SiH_4$, preferably while heating the substrate upon which the TiN is deposited. Deposition of the TiN barrier material and the exposure of that material to $SiH_4$ are generally performed in-situ, but this need not be the case.

Aspects of the invention also pertain to an integrated circuit (IC) or a partially fabricated integrated circuit having a barrier layer comprising a metal silicon nitride. The barrier layer will have a continuous morphology over a dielectric upon which it was formed and discontinuous morphology over a conductor upon which it was formed. Preferably, the metal silicon nitride is titanium silicon nitride.

Preferably such an IC is formed by the methods described herein, although this need not be the case. When circuits of the invention contain titanium silicon nitride barrier layers, forming the barrier layer comprises depositing a TiN barrier material over the dielectric and the conductor and converting at least part of the TiN barrier material to titanium silicon nitride. Preferably depositing the TiN barrier material comprises exposing the integrated circuit or partially fabricated integrated circuit to a gas-phase mixture of a tetrakis (dialkylamido) titanium compound and ammonia, while the integrated circuit or partially fabricated integrated circuit is heated. Most preferably, tetrakis(diethylamido) titanium is the organometallic used to form the TiN barrier material and a portion of the TiN barrier material is converted to titanium silicon nitride by exposure to $SiH_4$, under the conditions outlined above.

The integrated circuit or partially fabricated integrated circuits of the invention preferably contain copper for conductive routes with barrier layers formed from TiN barrier material deposited at between about 10 Å and 100 Å thick, more preferably about 50 Å thick.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term wafer will be used interchangeably with partially fabricated integrated circuit. One skilled in the art would understand that the term "partially fabricated integrated circuit" can refer to a silicon wafer during any of many stages of integrated circuit fabrication thereon.

Figure 1A:
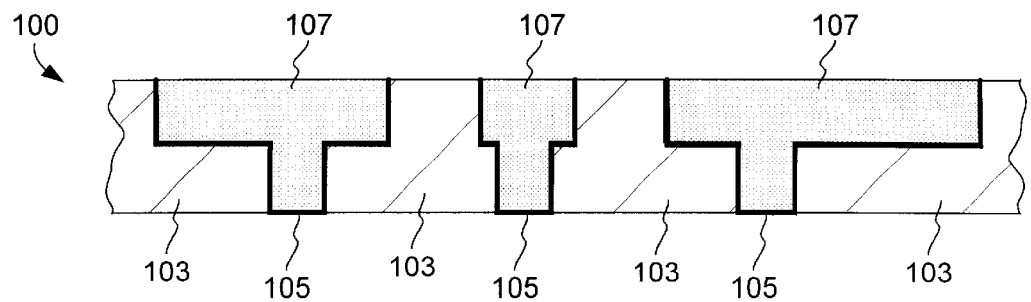
FIGS. 1A–G show cross-sectional depictions of a copper dual Damascene fabrication process.
Figure 1B:
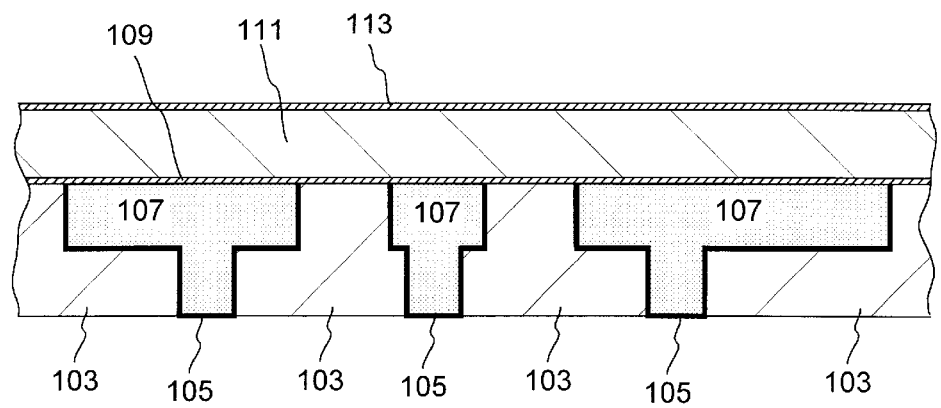
Figure 1C:
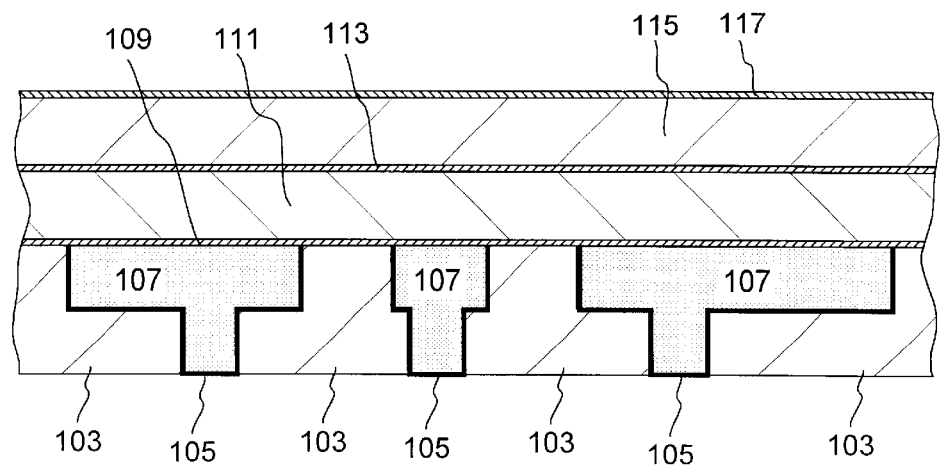
Figure 1D:
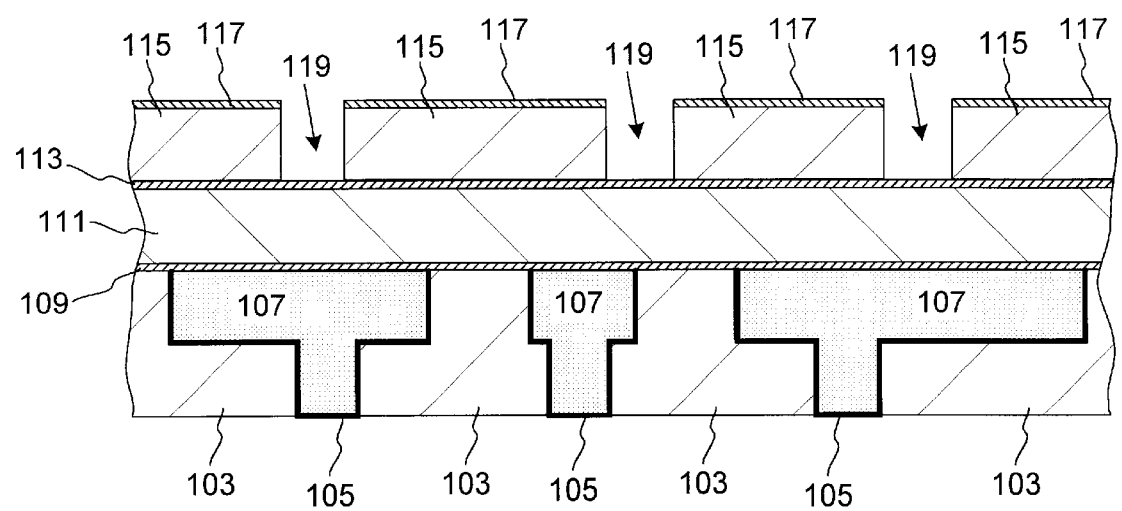
Figure 1E:
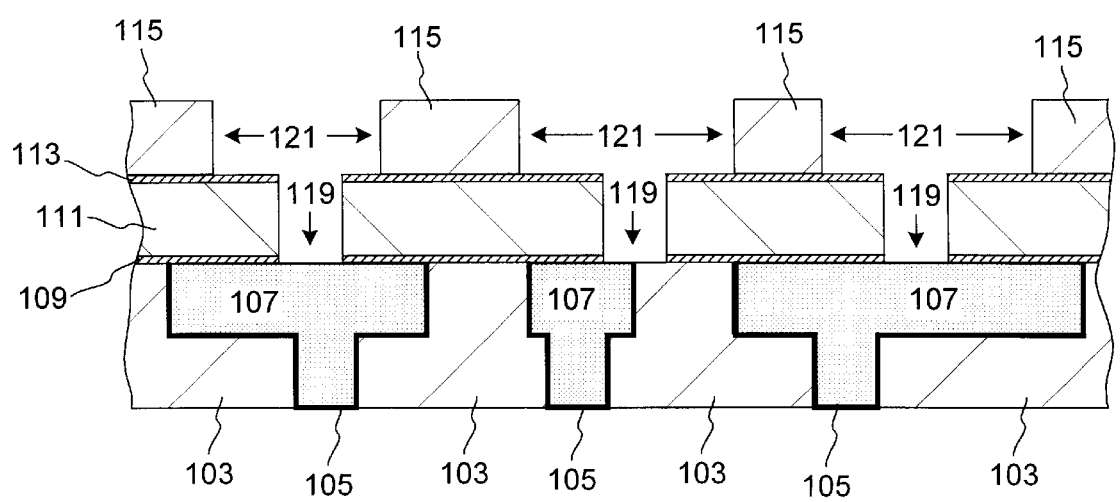
Figure 1F:
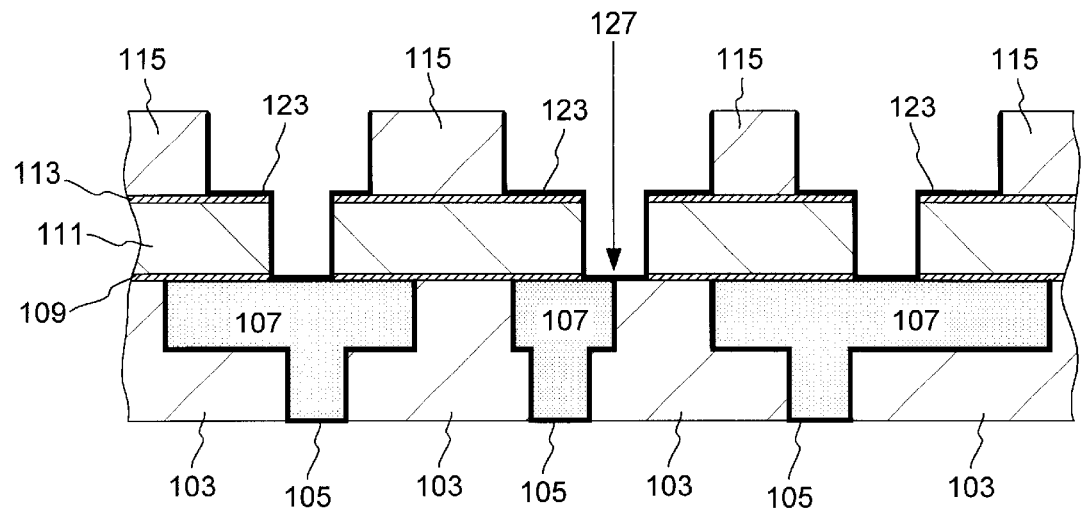
Figure 1G:
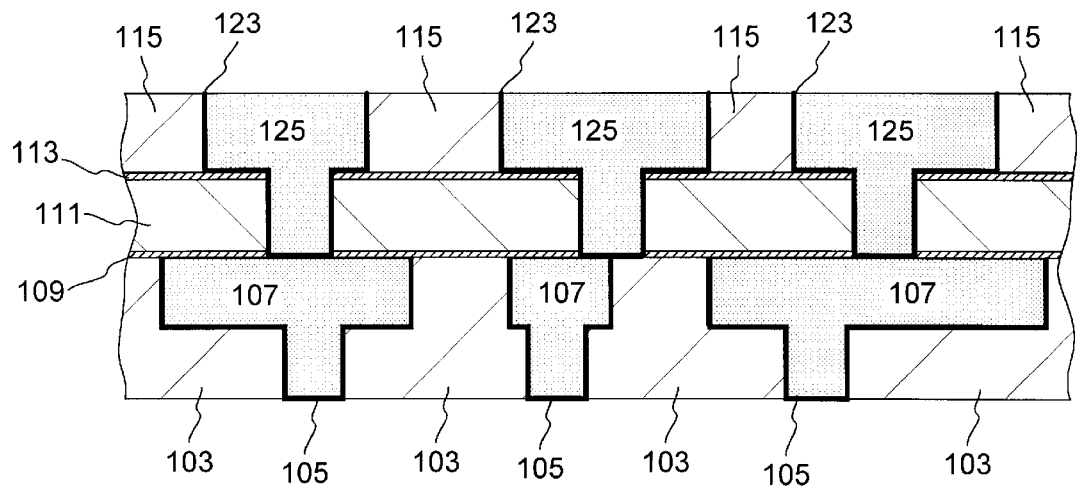
Figure 2A:
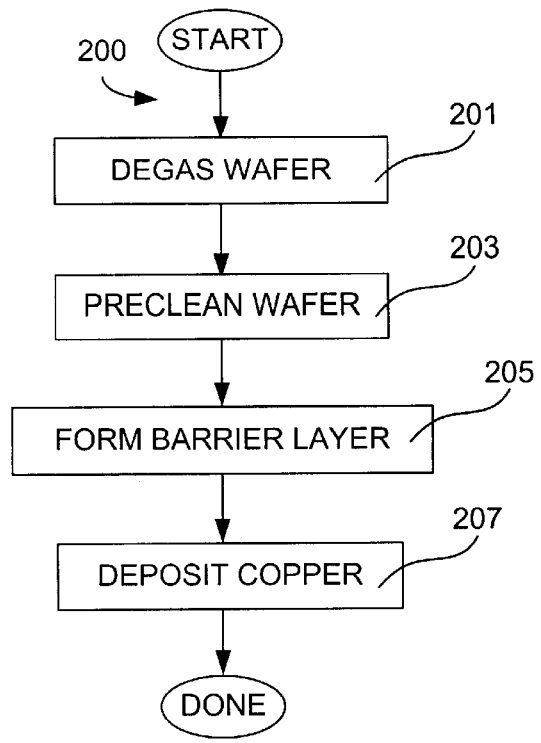
FIG. 2A depicts aspects of a process flow of a method of the invention.

As mentioned, the invention finds particular use in Damascene processing, especially when copper is the metal used for conductive routes. FIG. 2A depicts aspects of a process flow of a method of the invention in the context of copper Damascene processing. One can refer back to FIGS. 1A–1G for a slightly broader context. Specifically, referring to FIG. 1E, once vias and trenches have been formed in a wafer, typically a barrier layer will be deposited next. The process of laying down a barrier layer included preparation of the wafer and deposition of barrier material.

Process flow 200 begins with degassing the wafer. See 201. Degassing is done to remove any moisture or adsorbed gases from the wafer surface. In this invention, the wafer is heated at between about 200 and 400° C. under vacuum for between about 40 and 300 seconds.

After degassing, the wafer's surface features must be precleaned. See 203. As a result of the lithography processes used to form the vias and trenches, contaminants lie in these features. This is particularly true in the bottom of the vias. These contaminants may comprise etch residues. As well, copper oxide may be present due to exposure of the copper inlay surfaces to atmospheric conditions between process steps. Techniques for cleaning the partially fabricated integrated circuit surface features typically involve a physical sputter etch (up to 200 Å) using a noble gas plasma or a chemical cleaning method.

Once the wafer has been precleaned, the barrier layer is formed over the work surface of the wafer including the vias and trenches. See 205. Methods of the invention are particulary well suited for this purpose, as will be described in more detail below. Once the barrier layer is formed, copper is deposited in the features. See 207. The copper deposition process usually involves deposition of a copper seed layer (by PVD) over the diffusion barrier layer, followed by deposition of bulk fill copper by electroplating or electroless plating. Once the copper is inlaid into the features (over the diffusion barrier) the method is done.

Figure 2B:
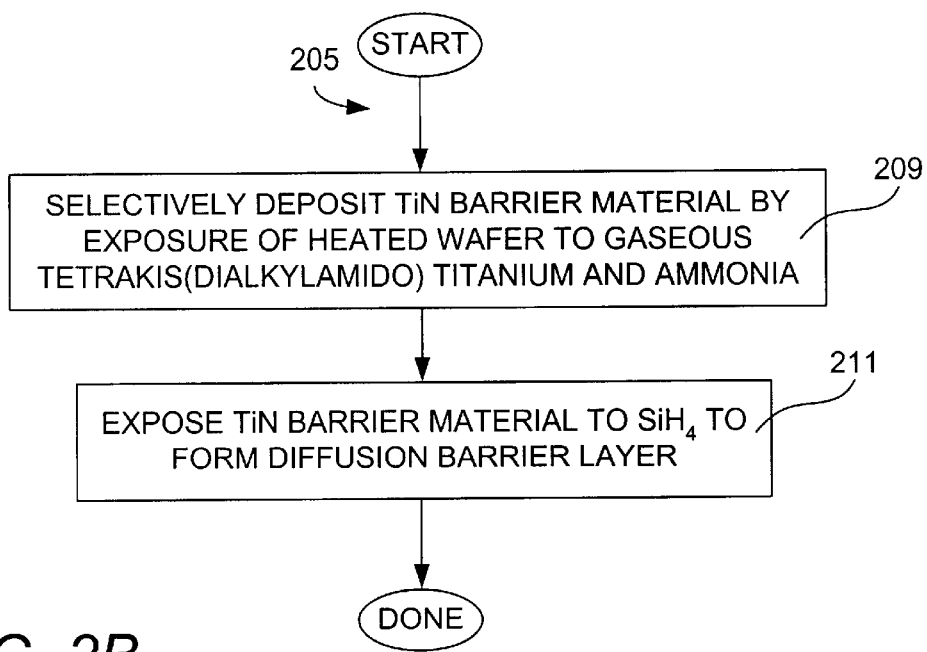
FIG. 2B depicts aspects of a process flow of a particularly preferred method of forming barrier layers of the invention.

FIG. 2B depicts a preferred method, 205, of forming a diffusion barrier layer of the invention. The resultant barrier layer is effective at stopping copper migration, has improved adhesion and wetting characteristics for deposition of seed layers, and provides low resistance in the regions between conductive layers in the partially fabricated integrated circuit or integrated circuit device.

First, a TiN barrier material is deposited on the wafer by exposure of the heated wafer to a gaseous mixture of a tetrakis(dialkylamido) titanium compound and ammonia under reduced pressure. See 209. The temperature of the wafer is preferably between 100 and 400° C., more preferably between about 250 and 350° C. The pressure is held at between about 10 and 400 torr, more preferably between about 50 and 70 torr. A preferred titanium compound for this process step is tetrakis(diethylamido) titanium (TDEAT), available from Schumacher, Inc. of San Diego, Calif. TDEAT is introduced at a flow rate of about 0.05 to 0.20 ml/min (liquid), more preferably about 0.10 ml/min. The liquid TDEAT is evaporated and carried in a stream of carrier gas (e.g. $N_2$) into the reactor. At the same time, ammonia is introduced at a flow rate of between about 4000 and 8000 sccm, more preferably between about 5000 and 6500 sccm. The deposition as described results in a deposition rate of TiN of about 1 to 10 Å per second. In a preferred embodiment, the TiN is deposited to a thickness of between about 10 and 100 Å, more preferably about 50 Å (as measured on the dielectric).

Figure 2C:
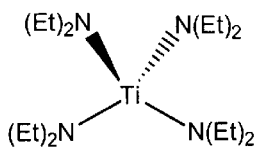
FIG. 2C depicts the molecular structure of TDEAT.

The molecular structure of TDEAT is illustrated in FIG. 2C. While not wishing to be bound by theory, it is believed that the mechanism of using TDEAT with ammonia is that the diethylamido ligands (shown) on TDEAT are transaminated while the TDEAT molecule is in gaseous form. This produces a titanium species having at least one—$NH_2$ ligand. Reductive elimination processes allow TiN to deposit directly on the heated substrate. This obviates carbon impurities left behind and harsh plasma treatments needed when such precursors are thermally decomposed on the wafer surface without prior transamination.

Figure 2D:
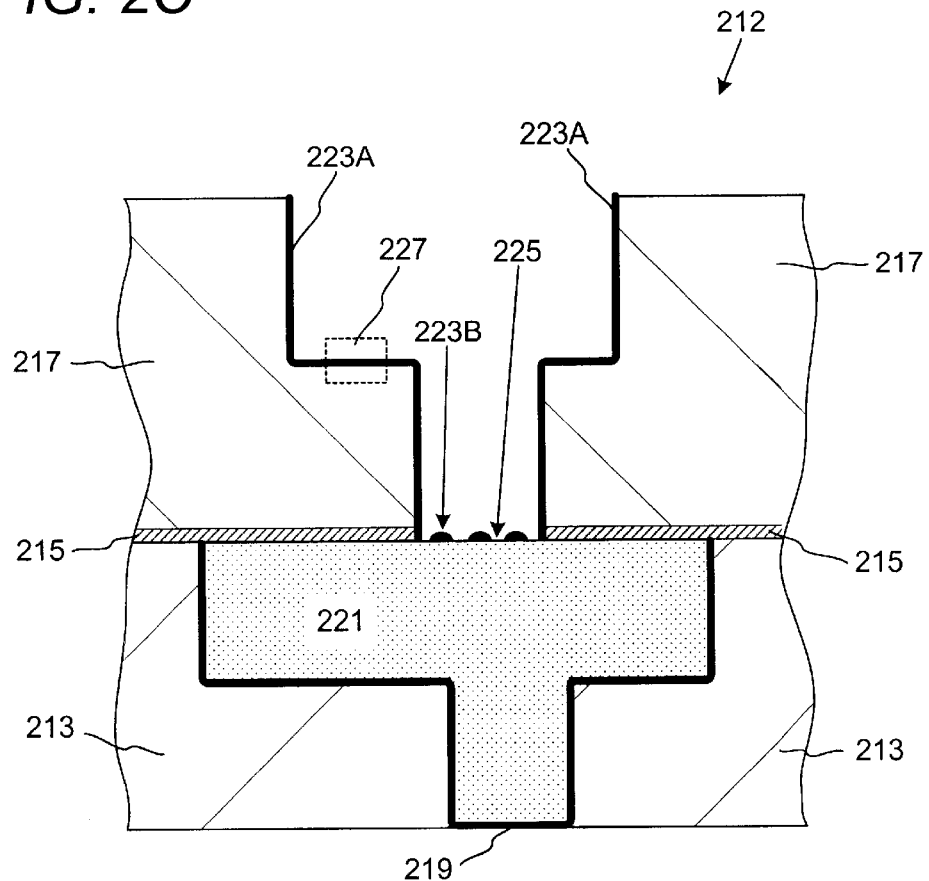
FIG. 2D depicts a cross sectional portion of a partially fabricated integrated circuit after deposition of TiN barrier material.

Under the specified conditions, the TiN barrier material is deposited onto the wafer such that the barrier material on the dielectric is continuous while on the conductor the TiN barrier material is discontinuous. This is illustrated in FIG. 2D. FIG. 2D depicts a cross sectional portion, 212, of a partially fabricated integrated circuit after deposition of TiN barrier material as described above for process step 209 in FIG. 2B. Via and trench features have been etched into dielectric layer 213, a diffusion barrier layer 219 deposited thereon, and copper conductive route 221 inlaid over barrier layer 219. A silicon nitride (or silicon carbide) barrier layer 215 was deposited next, follow by deposition of dielectric layer 217. Via and trench features have been etched into dielectric layer 217 and through barrier layer 215. Finally, TiN barrier material 223 is deposited as described above. The deposited TiN barrier material has two components, 223A and 223B. Titanium nitride 223A, deposited on dielectric 217, is continues, while titanium nitride deposited on copper conductive route 221 is discontinuous, forming islands 223B. In between TiN islands 223B are exposed copper regions 225.

While not wishing to be bound by theory, it is believed that the direct deposition of the TiN from the gas phase causes the deposited material to form islands on the copper regions. This allows at least some direct copper-to-copper contact between conductive routes after subsequent copper inlay over the barrier layer. Process step 209 is one way to achieve the selective deposition described above. This CVD technique is reported by Gordon et al. in U.S. Pat. No. 5,139,825, which is incorporated by reference in its entirety for all purposes. One skilled in the art would understand that there may be other ways (materials, process conditions, apparatus, etc.) of achieving this outcome and that other metal-nitride barrier materials may be used.

We have found that when the substrate used for deposition of TiN in this way is a partially fabricated integrated circuit having both exposed regions of dielectric and conductor, the TiN deposited does not form an effective barrier layer itself (as reported by Gordon et al.), but must be subsequently converted to an effective barrier layer by some means. Referring again to the process flow in FIG. 2B, the TiN barrier layer material deposited as described above for 209 is then exposed to $SiH_4$ to form an effective barrier layer. See 211. This process, referred to as a "silane soak," is one way to achieve this result; one skilled in the art would understand that there may be other ways of achieving this outcome (especially if other metal-nitride barrier materials are used). This "silane soak" method is reported in U.S. Patent application, Ser. No. 09/449,008 filed on Nov. 24, 1999 by Danek et al, which is incorporated by reference in its entirety for all purposes. Briefly, this is an in situ thermal process, wherein the newly deposited TiN barrier material (the wafer still heated from the TiN deposition conditions) is exposed to silane. This converts at least part of the TiN to titanium silicon nitride ($TiSi_xN_y$) forming the barrier layer. The value of x is very small for the overall film (not uniformly distributed), typically<0.1; the value of y is about 1.2. After the silane soak, method 205 is complete.

Figure 2E:
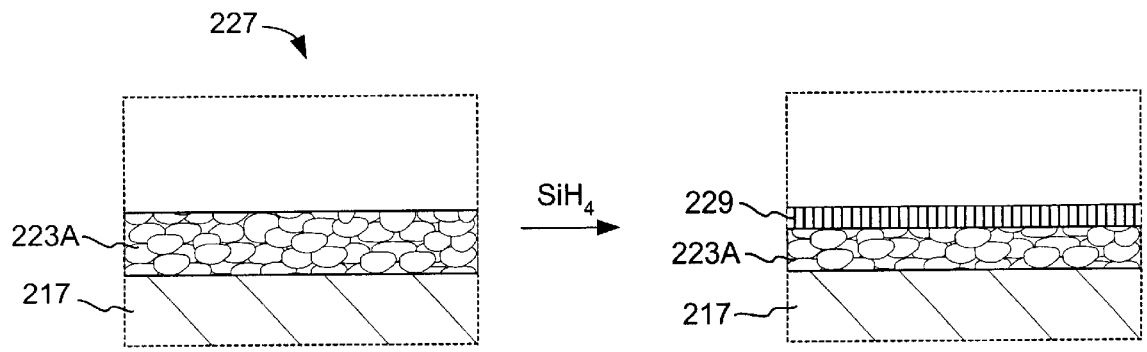
FIG. 2E depicts a close up cross sectional representation of TiN barrier material morphology on a dielectric and titanium silicon nitride formation therefrom.

Once the TiN barrier material is exposed to the silane soak, the continuous barrier layer regions exhibit excellent resistance to copper diffusion, and the discontinuous barrier layer regions (formed as "islands" over the copper surfaces) allow excellent electrical conduction (low resistance) between copper conductive routes, once new routes are inlayed over the completed barrier layer. FIG. 2E depicts a close up cross sectional representation 227 (dashed box 227 from FIG. 2D) showing the TiN barrier material morphology on the dielectric and titanium silicon nitride formation therefrom. The continuous TiN layer 223A on the dielectric, although continuous, has a fine (microscopic) grain structure. When exposed to the silane soak, at least part of the TiN is converted to titanium silicon nitride 229, as depicted in stylized form in FIG. 2E. This final structure forms part of the barrier layer of the invention. The portions of the titanium silicon nitride formed from the TiN islands over the copper regions do not form an effective barrier to electrical conduction. Thus the methods of the invention produce barrier layers having different morphology, depending on what material (dielectric or conductor) that they are formed upon.

Part of the invention are integrated circuits or partially fabricated integrated circuits having at least one barrier layer comprising a metal silicon nitride, said barrier layer having continuous morphology over a dielectric upon which it was formed and discontinuous morphology over a conductor upon which it was formed. Preferably such an integrated circuit is formed by the methods described herein and the metal silicon nitride is titanium silicon nitride. In the latter scenario, in the integrated circuit or partially fabricated integrated circuit, forming the barrier layer comprises depositing a TiN barrier material over the dielectric and the conductor and converting at least part of the TiN barrier material to titanium silicon nitride. Preferably depositing the TiN barrier material comprises exposing the integrated circuit or partially fabricated integrated circuit to a gas-phase mixture of a tetrakis(dialkylamido) titanium compound and ammonia, while the integrated circuit or partially fabricated integrated circuit is heated. Most preferably, tetrakis (diethylamido) titanium is the organometallic used to form the TiN barrier material and a portion of the TiN barrier material is converted to titanium silicon nitride by exposure to $SiH_4$, under the conditions outlined above.

As mentioned, the integrated circuits or partially fabricated integrated circuits of the invention preferably contain copper for conductive routes with barrier layers formed from TiN barrier material deposited at between about 10 Å and 100 Å thick, more preferably about 50 Å thick. As mentioned, the via resistance afforded by the barrier layers of the invention is low.

EXPERIMENTAL

Figure 3:
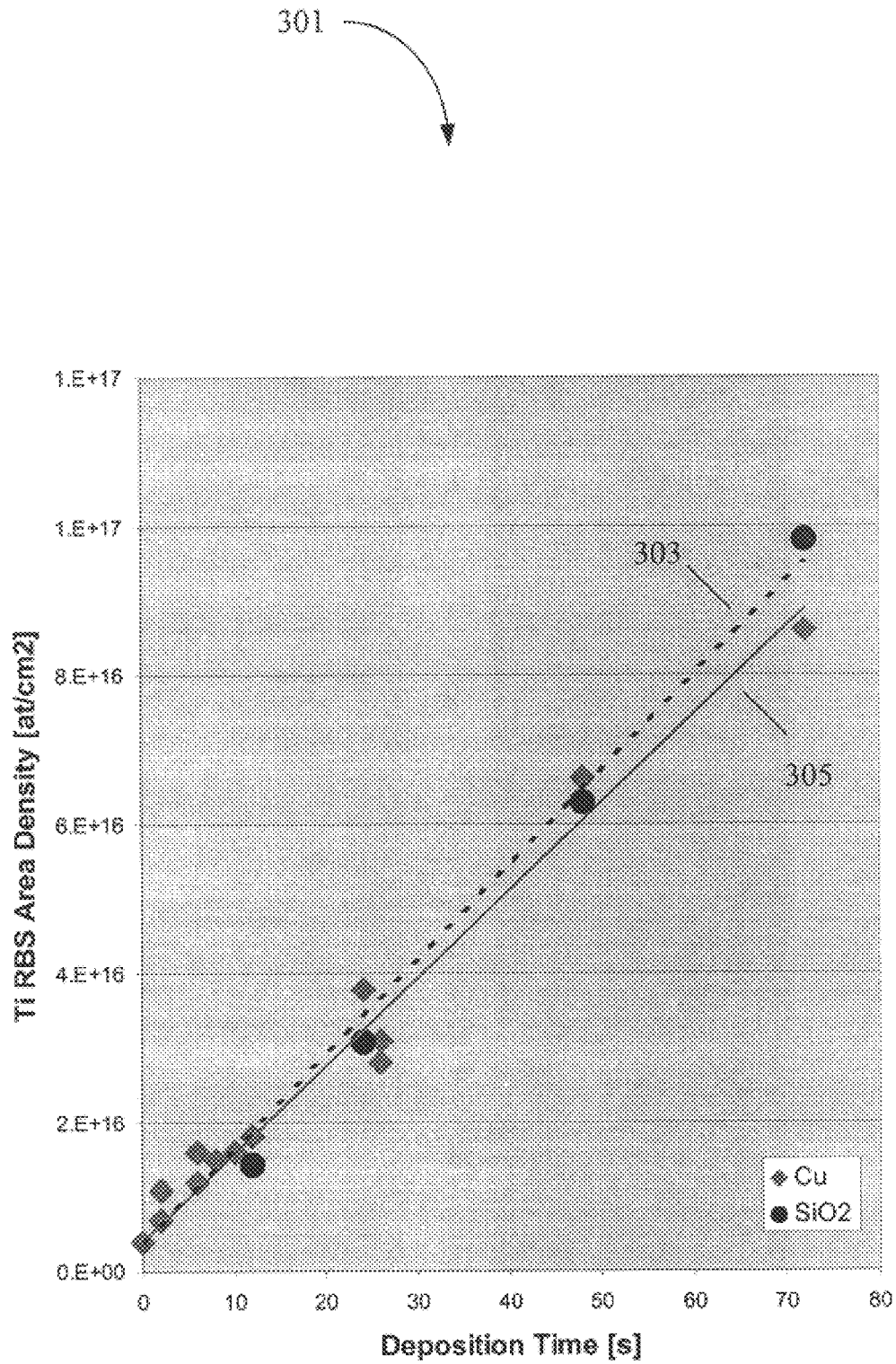
FIG. 3 is a plot of Rutherford Back Scattering (RBS) signal, in atoms per square centimeter, versus the deposition time on $SiO_2$ and Cu surface, in a preferred embodiment of the invention.

The following experiments demonstrate that the current invention is effective at depositing a continuous layer of TiN barrier material on the dielectric surfaces, as desired, while the TiN deposited on the underlying copper does not increase the resistance of the copper interconnect. FIG. 3 is a plot of Rutherford Back Scattering (RBS) signal (in titanium atoms per square centimeter) versus the deposition time (in seconds) of a preferred embodiment of the current invention. See 301. Note that 50 Å of TiN was deposited after about 11 seconds and 100 Å was deposited after about 24 seconds. The plot shows results for deposition on both SiO$_2$ dielectric 303, and copper 305 surface at the bottom of a via, on a partially fabricated integrated circuit. The two lines have approximately the same slope, indicating that the amount of TiN deposited on both surfaces is about the same, i.e., that the current invention does not change or reduce the deposition rate of TiN on the copper versus the dielectric. Also, the RBS data indicates that there is no deposition delay on the copper substrate.

It was therefore and unexpected result that the nature of the deposition, more specifically the nucleation, is differential on the dielectric versus the copper. While not wishing to be bound by theory, as mentioned, it is believed that the TiN deposits on the copper in isolated islands. The quality of the copper-to-copper interconnect thus is not compromised by the TiN barrier material, and therefore via resistance increases very little or not at all, for depositions of up to about 50 to 75 Å of TiN.

Figure 4:
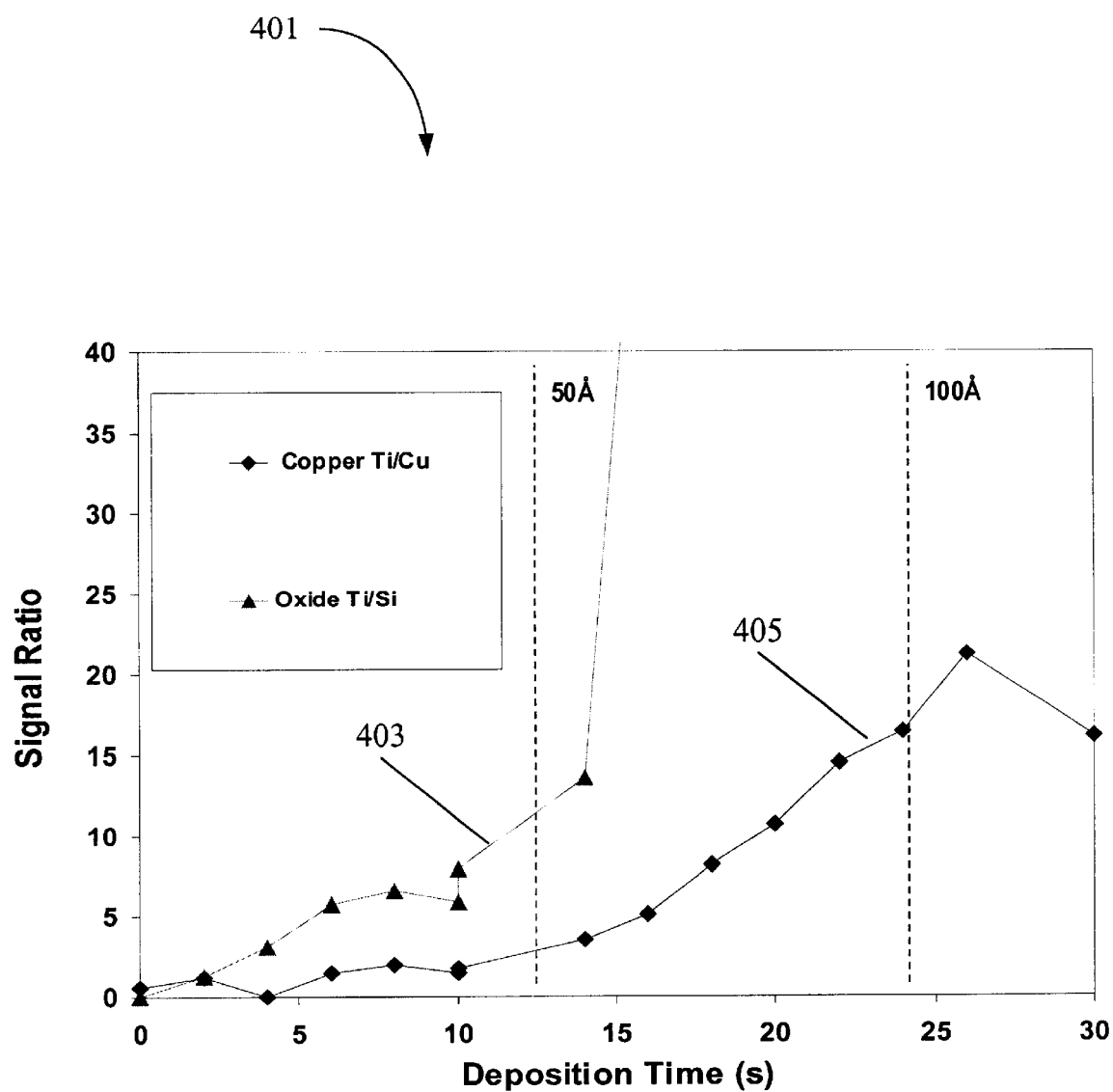
FIG. 4 is an X-Ray Photoelectron Spectroscopy (XPS) plot versus the same deposition time as in FIG. 3.

FIG. 4 confirms this observation. FIG. 4 is an X-Ray Photoelectron Spectroscopy XPS) plot versus the same deposition time (first 30 seconds in this case) as in FIG. 3. See 401. The XPS method used in FIG. 4 returns some level of signal for substrates up to a depth of about 50 Å of continuous film. Line 403 shows the ratio of Ti to Si signal, on the dielectric (oxide of silicon). The ratio of Ti to Si starts off very low, below 1, and then slowly climbs until about 15 seconds (75 Å of deposition), when the signal ratio becomes very high. The Si signal at about 15 seconds dropped to zero, thus yielding a signal ratio of infinity-hence, these data points are not shown. The rapid rise in the signal ratio confirms that the deposition of TiN on the dielectric results in a continuous layer that obscures the dielectric very quickly.

Line 405 corresponds to deposition on the copper surface. The Ti to Cu signal ratio remains low until at least 25 seconds (which corresponds to a 100 Å thick continuous deposition on the dielectric) showing that the film remained discontinuous on the copper.

Figure 5A:
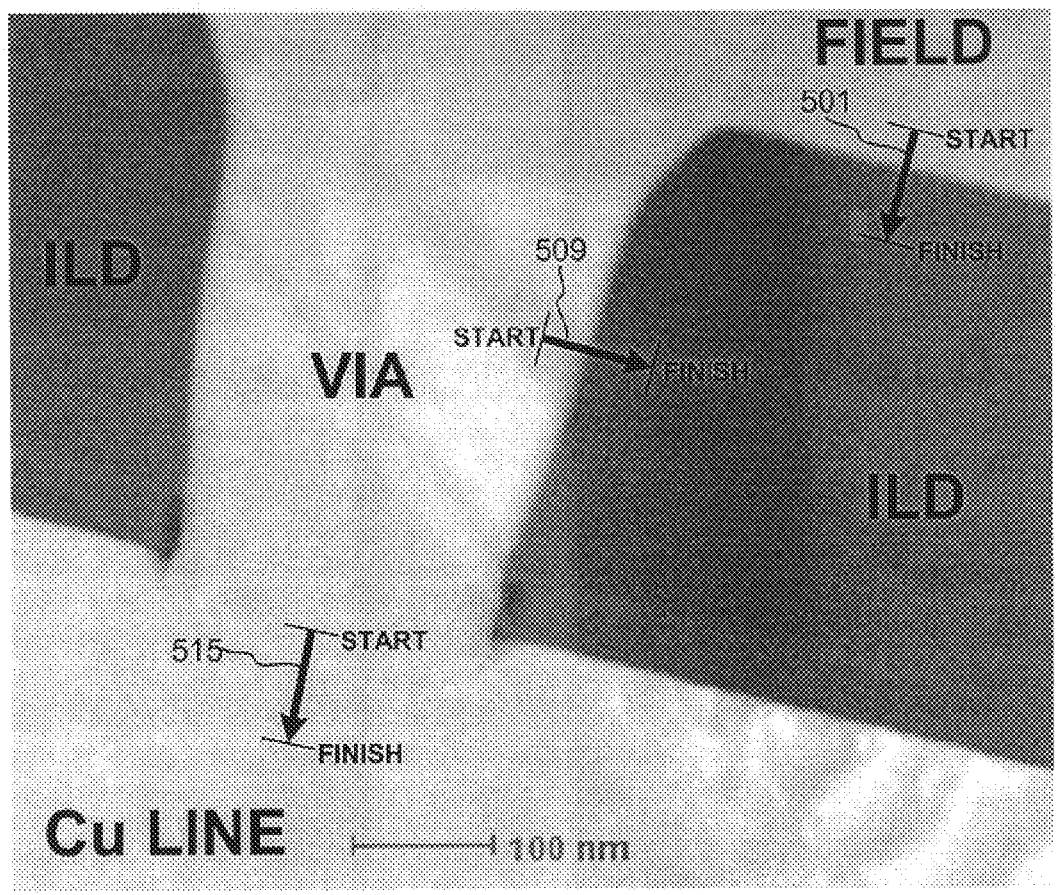
FIG. 5A is a dark field STEM showing regions on a substrate wafer of the invention where Electron Energy Loss Spectroscopy (EELS) was used to evaluate the substrate surface in the field, on the sidewall of a via, and at the bottom of a via.

FIG. 5A is a dark field STEM (Scanning Transmission Electron Microscopy) showing regions on a substrate wafer of the invention where Electron Energy Loss Spectroscopy (EELS) was used to evaluate the substrate surface in the field, on the sidewall of a via, and at the bottom of a via. For partially fabricated integrated circuits tested, a barrier layer was formed in accordance with the invention on a wafer substrate, a copper seed layer deposited, and finally copper fill applied. For the wafer depicted in the STEM of FIG. 5A, the barrier layer was deposited (to a thickness of 50 Å) with CVD TiN by a preferred embodiment of the invention, followed by a PVD copper seed layer and electrofill. Denoted in FIG. 5A, are the copper line, the ILD (interlayer dielectric), the via, and the field copper. In FIG. 5A, reference numbers 501, 509, and 515, refer to areas of the substrate where EELS (Electron Energy Loss Spectroscopy) was used to evaluate the substrate surface. The dark arrows, with start and finish points, indicate the path along which the actual measurements were taken in each of the specified regions.

Figure 5B:
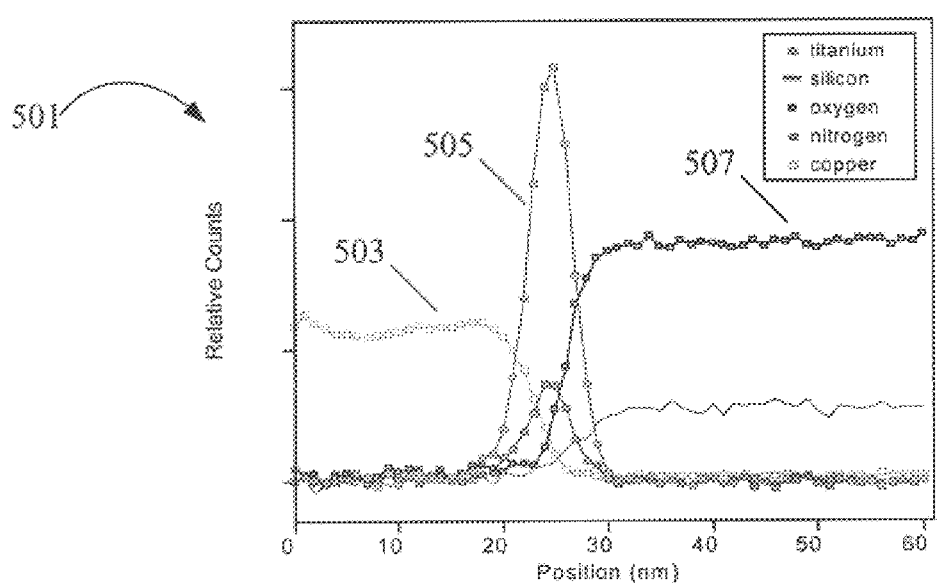
FIGS. 5B–5D are Electron Energy Loss Spectroscopy (EELS) plots, that compare the substrate surface (50 Å TiN deposition) in the field, on the sidewall of a via, and at the bottom of a via.
Figure 5C:
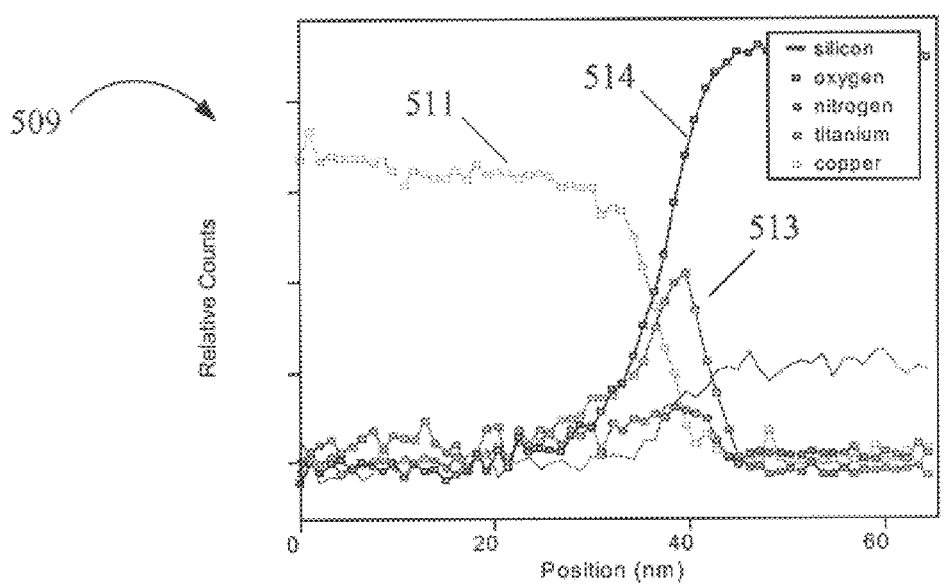
Figure 5D:
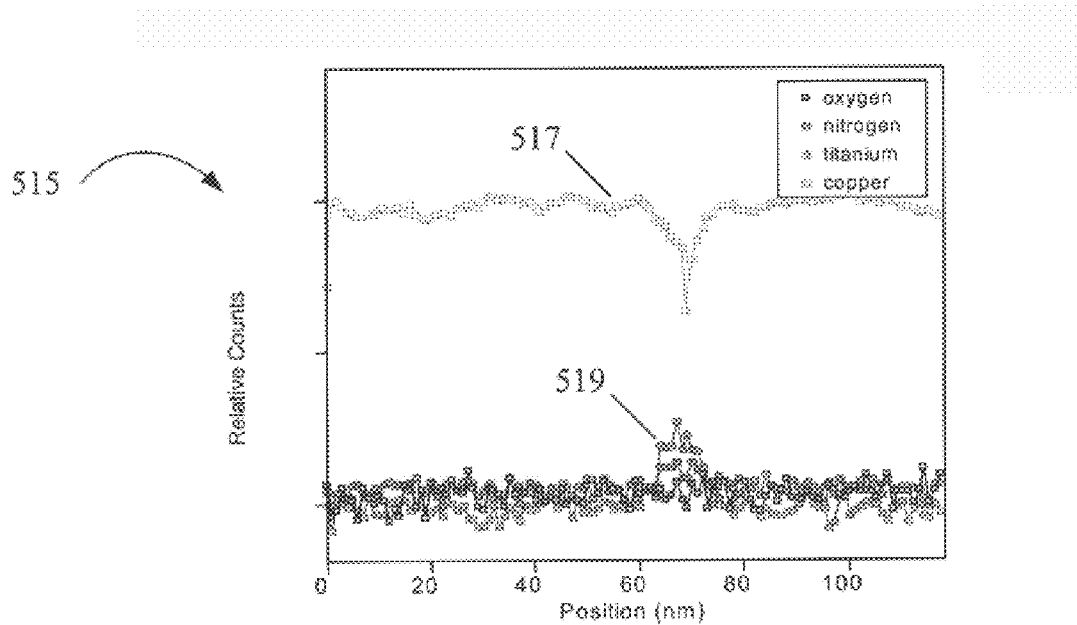

FIGS. 5B–5D are the actual plots of the EELS data taken along the paths indicated in FIG. 5A. FIG. 5B is an EELS plot taken in the field of the integrated circuit. See 501 (also refer to FIG. 5A). The first broad peak from about 0 to 20 nm corresponds to the copper metal seed layer 503, followed by a Ti spike 505, and then a broad dielectric peak 507. The positional measurements (nanometers) of the X-axis correspond to the probe moving down through the substrate. The clarity of the Ti peak 505, indicates that a continuous layer of TiN was laid down on the dielectric.

Similar results is shown in FIG. 5C, which is an EELS plot taken on the sidewall of a via. See 509 (also refer to FIG. 5A). Similar peaks are shown for the copper metal seed layer 511, Ti 513, and the dielectric 514. The fact that the Ti and dielectric peaks in this plot overlap is an artifact of the electron beam spot size.

FIG. 5D is an EELS plot taken at the bottom of the via. See 515 (also refer to FIG. 5A). Note that the plot shows essentially one broad copper peak 517, throughout the plot, with only a small Ti signal 519 at about 70 nm. The lack of a clear Ti peak indicates that there is deposition of the Ti on the copper is not continuous.

Figure 5E:
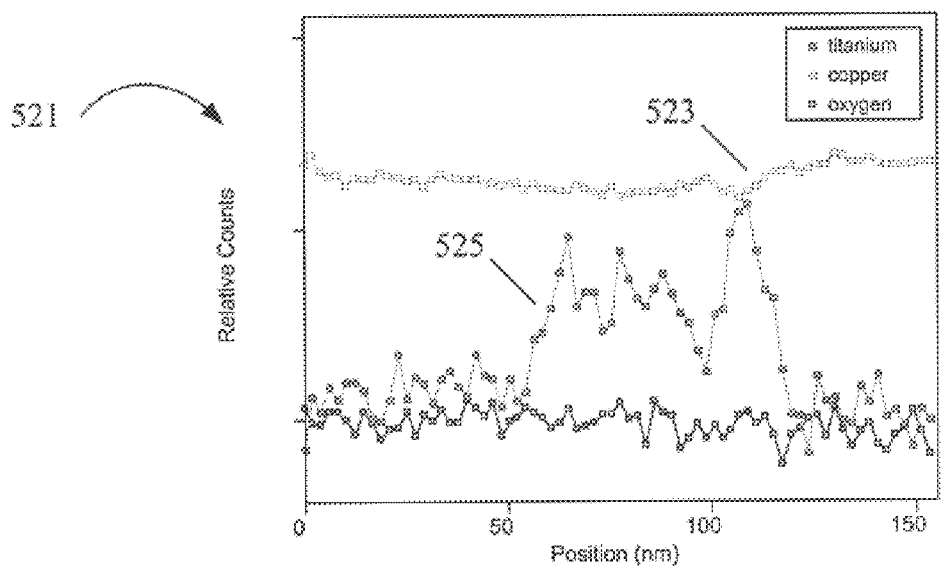
FIG. 5E is an Electron Energy Loss Spectroscopy (EELS) plot showing the substrate surface at the bottom of a via (100 Å TiN deposition).

FIG. 5E is an EELS plot taken at the bottom of a via where the TiN was deposited to a thickness of 100 Å. See 521. This plot also shows a broad copper peak (see 523), as well a stronger Ti signal 525, probably indicating that continuous deposition of the Ti has begun. Note that the Ti signal is still less distinct than the Ti signal obtained in the field for 50 Å TiN deposition (compare with 505 in FIG. 5B). FIG. 5E indicates that the discontinuity of the TiN on the copper (corresponding to a 100 Å continuous deposition on the dielectric) may be compromised, but perhaps not entirely.

Figure 6:
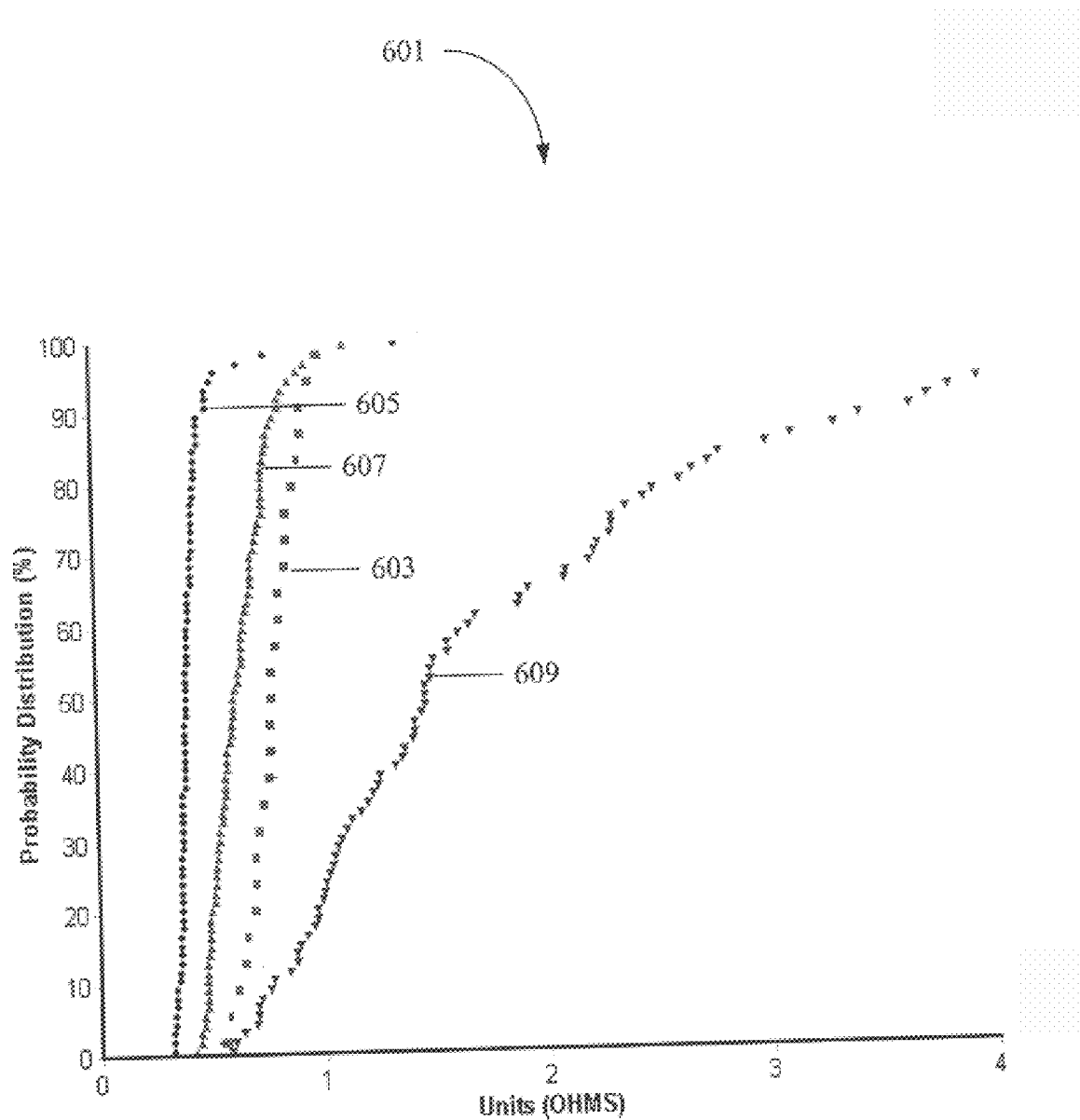
FIG. 6 demonstrates the results of using the invention with actual via resistances at the 0.25 $\mu$m technology node.

FIG. 6 demonstrates the results of using the invention with actual via resistances at the 0.18μm technology node. See 601. Line 603 shows the distribution of via resistances obtained from a wafer using the best conventional method of barrier deposition for purposes of low via resistance, that is, (HCM PVD deposition of Ta). Lines 603 and 605 show that considerably better values are obtained by the current invention for TiN deposition at 50 Å and even 75 Å, followed by conversion at least partially, to Ti(Si$_x$)N$_y$. Line 609 shows that unacceptable results are obtained for a deposition which corresponds to 100 Å on the dielectric.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a diffusion barrier layer on a partially fabricated integrated circuit containing exposed regions of a dielectric and a conductor, the method comprising:
   (a) depositing a metal-nitride barrier material such that the morphology of the metalnitride barrier material on the dielectric is continuous and the morphology of the metalnitride barrier material on the conductor is discontinuous; and
   (b) converting at least part of the metal-nitride barrier material to a metal silicon nitride to form the diffusion barrier layer.

2. The method of claim 1, wherein the conductor is copper.

3. The method of claim 2, wherein the metal-nitride barrier material is TiN and the metal silicon nitride is titanium silicon nitride ($TiSi_xN_y$).

4. The method of claim 3, wherein (a) comprises exposing the partially fabricated integrated circuit to a gas-phase mixture of a tetrakis(dialkylamido) titanium compound and ammonia, while the partially fabricated integrated circuit is heated.

5. The method of claim 4, wherein the tetrakis (dialkylamido) titanium compound is TDEAT.

6. The method of claim 3, wherein (b) comprises exposure of the deposited TiN barrier material to $SiH_4$.

7. The method of claim 1, wherein (a) and (b) are performed in-situ.

8. The method of claim 3, wherein the TiN barrier material deposited on the dielectric is between about 10 Å and 100 Å thick.

9. The method of claim 3, wherein the TiN barrier material deposited on the dielectric is about 50 Å thick.

10. The method of claim 4, wherein the ammonia is introduced into the gas-phase mixture at a rate of between about 4000 and 8000 SCCM.

11. The method of claim 4, wherein the ammonia is introduced into the gas-phase mixture at a rate of between about 5000 and 6500 SCCM.

12. The method of claim 4, wherein the method is performed at a pressure of between about 10 and 400 torr.

13. The method of claim 4, wherein the method is performed at a pressure of between about 50 and 70 torr.

14. The method of claim 4, wherein the method is performed at a temperature of between about 100 and 400° C.

15. The method of claim 4, wherein the method is performed at a temperature of between about 250 and 350° C.

16. The method of claim 4, wherein the TiN barrier material is deposited on the dielectric at a rate of between about 1 and 10 Å per second.

17. The method of claim 5, wherein the TDEAT is introduced as a liquid into the gas-phase mixture at a rate of between about 0.05 and 0.2 m/min.

18. The method of claim 5, wherein the TDEAT is introduced as a liquid into the gas-phase mixture at a rate of about 0.1 ml/min.

19. The method of claim 6, further comprising heating the wafer.

20. The method of claim 2, wherein the diffusion barrier layer forms a part of a Damascene structure.

* * * * *